US010109819B2

(12) United States Patent  
Yoshida et al.

(10) Patent No.: US 10,109,819 B2  
(45) Date of Patent: *Oct. 23, 2018

(54) LIGHT-EMITTING DEVICE

(71) Applicant: PIONEER CORPORATION, Kawasaki-shi, Kanagawa (JP)

(72) Inventors: Ayako Yoshida, Kawasaki (JP); Kazuo Kuroda, Kawasaki (JP)

(73) Assignee: PIONEER CORPORATION, Kawasaki-Shi, Kanagawa (JP)

( * ) Notice: Subject to any disclaimer, the term of this patent is extended or adjusted under 35 U.S.C. 154(b) by 0 days.

This patent is subject to a terminal disclaimer.

(21) Appl. No.: 15/411,104

(22) Filed: Jan. 20, 2017

(65) Prior Publication Data

US 2017/0133636 A1     May 11, 2017

Related U.S. Application Data

(63) Continuation of application No. 14/440,697, filed as application No. PCT/JP2012/078969 on Nov. 8, 2012, now Pat. No. 9,590,209.

(51) Int. Cl.
  *H01L 51/52* (2006.01)
  *H01L 27/32* (2006.01)
(52) U.S. Cl.
  CPC ...... *H01L 51/5271* (2013.01); *H01L 27/3218* (2013.01); *H01L 51/5218* (2013.01); *H01L 51/5234* (2013.01); *H01L 2251/5361* (2013.01)
(58) Field of Classification Search
  CPC . H01L 51/50; H01L 51/5271; H01L 51/5218; H01L 51/5234; H01L 27/3218;
  (Continued)

(56) References Cited

U.S. PATENT DOCUMENTS 8,716,069 B2 * 5/2014 Xue ................... H01L 23/3171  
  257/672  
9,057,872 B2   6/2015 Mignard et al.  
  (Continued)

FOREIGN PATENT DOCUMENTS

JP           2625177 B2     7/1997  
JP        2003217868 A     7/2003  
(Continued)

OTHER PUBLICATIONS

Office Action for JP App No. 2014-545503 dated Apr. 26, 2016, 7 pgs.

(Continued)

*Primary Examiner* — Alexander Oscar Williams  
(74) *Attorney, Agent, or Firm* — Procopio, Cory, Hargreaves & Savitch LLP

(57) ABSTRACT

A mirror device has a plurality of organic EL elements and a plurality of metal mirror surface portions that are divided by banks made of a light-transmissive dielectric material and aligned on a substrate. Each of the organic EL elements has an organic layer that is formed between a light-transmissive electrode and a reflection electrode and contains a light-emitting layer. Each of the metal mirror surface portions and each of the organic EL elements or each group of the metal mirror surface portions and each group of the organic EL elements are alternately disposed.

6 Claims, 7 Drawing Sheets

(58) Field of Classification Search
CPC . H01L 2251/5361; H01L 51/52; H01L 27/32; H01L 257/40; H05B 33/24; H05B 33/12; H05B 33/22
USPC .......................................................... 257/40
See application file for complete search history.

(56) References Cited

U.S. PATENT DOCUMENTS

| | | | |
|---|---|---|---|
| 9,318,725 B2 | 4/2016 | Li | |
| 9,399,428 B2 | 7/2016 | Yoshida et al. | |
| 9,640,207 B2* | 5/2017 | Tsuchiya | G11B 5/5569 |
| 2007/0075634 A1 | 4/2007 | Lee et al. | |
| 2007/0096112 A1* | 5/2007 | Hoshi | H01L 51/52 |
| | | | 257/79 |
| 2007/0210700 A1* | 9/2007 | Kato | H01L 51/5203 |
| | | | 313/504 |
| 2013/0303777 A1* | 11/2013 | Okamoto | C07F 15/002 |
| | | | 548/103 |
| 2014/0152637 A1* | 6/2014 | Fujita | C07F 15/002 |
| | | | 345/211 |
| 2015/0298602 A1* | 10/2015 | Yoshida | H01L 51/5271 |
| | | | 362/549 |
| 2016/0315289 A1* | 10/2016 | Yoshida | H01L 51/5271 |

FOREIGN PATENT DOCUMENTS

| | | |
|---|---|---|
| JP | 2006156205 A | 6/2006 |
| JP | 2007080579 A | 3/2007 |
| JP | 2008041297 A | 2/2008 |
| JP | 2008192314 A | 8/2008 |
| JP | 2009206041 A | 9/2009 |
| WO | 2005034586 A1 | 4/2005 |
| WO | 2012108142 A1 | 8/2012 |

OTHER PUBLICATIONS

International Search Report and Written Opinion for PCT App No. PCT/JP2012/078969 dated Feb. 12, 2013.

Office Action for Japanese Patent Application No. 2016-242849, dated Sep. 11, 2017, 6 pages. English translation provided.

* cited by examiner

LIGHT-EMITTING DEVICE

CROSS-REFERENCE TO RELATED APPLICATIONS

This application is a Continuation of U.S. application Ser. No. 14/440,697 filed May 5, 2015 issued as U.S. Pat. No. 9,590,209, which is a U.S. National Stage entry of PCT Application No. PCT/JP2012/078969 filed on Nov. 8, 2012. The contents of the foregoing are incorporated by reference.

TECHNICAL FIELD

The present invention relates to a mirror device having a light-emitting function including an organic electroluminescent element.

BACKGROUND ART

An organic electroluminescent element is a light-emitting element that is configured, for example, by layering an anode, an organic layer including a light-emitting layer, and a cathode in this order on a transparent glass substrate, and exhibits electroluminescence (hereinafter, referred to as EL) by injection of current into the organic layer through the anode and the cathode. The organic EL element is a self-luminous surface emission device, and is used for a display device and an illuminator.

As a mirror device, a mirror equipped with an EL illuminator in which an organic EL element is disposed around the mirror in a frame shape and an object such as the face and the like of a user can be reflected in the mirror has been proposed (see Patent Document 1).

A sun visor assembly for automotive vehicles with an illuminated rear-view mirror has also been proposed (see Patent Document 2).

CITATION LIST

Patent Document

Patent Document 1: Japanese Patent Application Laid-Open No. 2003-217868
Patent Document 2: Japanese Patent No. 2625177

SUMMARY OF THE INVENTION

Problem to be Solved by the Invention

In the mirror equipped with an EL illuminator described in Patent Document 1, a light source such as an organic EL element is disposed on a frame around the mirror, and therefore the area of the mirror decreases. The mirror has a defect in which a portion of the face that the user wants to see cannot be accurately illuminated with light.

In the sun visor assembly described in Patent Document 2, an illumination portion such as a lamp is directly provided in front of both sides of a mirror surface. Therefore, the sun visor assembly has a problem in which it is difficult to emit light uniformly.

In the above-described mirror device, a light-emitting portion is added and disposed simply in front of and behind the mirror. Therefore, the mirror device has a defect in which the thickness of the whole mirror device increases.

As an example, an object of the present invention is to provide a mirror device that has a light-reflecting function and suppresses an increase in the thickness of the device to emit light forward.

Means to Solve the Problem

A mirror device of the present invention has a plurality of organic EL elements and a plurality of metal mirror surface portions that are divided by banks made of a light-transmissive dielectric and aligned on a substrate. In the mirror device, each of the organic EL elements has an organic layer that is formed between a light-transmissive electrode and a reflection electrode and contains a light-emitting layer, and each of the metal mirror surface portions and each of the organic EL elements or each group of the metal mirror surface portions and each group of the organic EL elements are alternately disposed.

DESCRIPTION OF EMBODIMENTS

Hereinafter, embodiments of the present invention will be described with reference to the drawings.

First Embodiment

Figure 1:
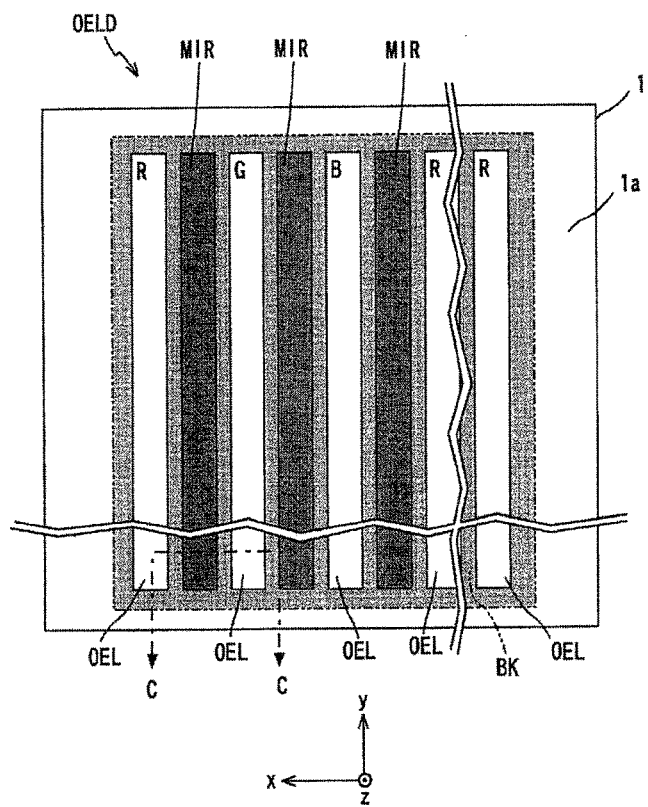
FIG. 1 is a front view of a mirror device of an organic EL panel according to a first embodiment of the present invention, which is partially cut out.

FIG. 1 shows a configuration of a mirror device that is an organic EL panel OELD according to a first embodiment of the present invention. The organic EL panel OELD includes a plurality of organic EL elements OELs and a plurality of metal mirror surface portions MIRs that are divided by a bank BK on a light-transmissive plate made of a glass or a resin as a substrate 1. The organic EL elements OELs each have a strip-shaped light-emitting portion that extends in a y-direction of an xy main plane of the substrate 1, and are groups of organic EL elements R, G, and B that emit light of different luminescent colors such as red R, green G, and blue B, respectively, from a front surface 1a of the light-transmissive substrate 1. The metal mirror surface portions MIRs are each a strip-shaped light-reflecting portion that extends in the y-direction of the xy main plane of the substrate 1, and reflects light from the outside through the front surface 1a of the light-transmissive substrate 1. As shown in FIG. 1, each of the organic EL elements OELs and each of the metal mirror surface portions MIRs are alternately disposed on a back surface of the light-transmissive substrate. For example, the bank BK is made of a light-transmissive dielectric material such as an optical glass and an optical resin. The organic EL elements R, G, and B are aligned in parallel. Each set of the organic EL elements OELs having R, G, and B luminescent colors that emit light with luminescent colors of red, green, and blue, respectively, is aligned in an x direction.

As described above, the organic EL elements OELs and the metal mirror surface portions MIRs are repeatedly disposed in stripes so as to be in parallel in certain order at uniform intervals. In the embodiment, for example, the widths of the metal mirror surface portions MIRs and the organic EL elements OELs are each 0.1 mm or less, which cannot be distinguished with the naked eye, and a distance between the metal mirror surface portions MIRs and the organic EL elements OELs is as short as 0.1 mm or less, light is emitted from the organic EL elements of surface emission during driving of the elements. Therefore, the organic EL panel can be utilized as a light-emitting mirror as if a mirror that emits light from the whole surface. In addition, the organic EL panel can function as one mirror during non-driving of the elements. When the brightnesses of the organic EL elements are adjusted each or according to each group of colors, light that is recognized as a single luminescent color by mixing red, green, and blue lights at any ratio is emitted from the front surface of the substrate 1 as a light extraction surface. All the organic EL elements OELs are connected to an element driving unit, which is not illustrated in the drawing.

Figure 2:
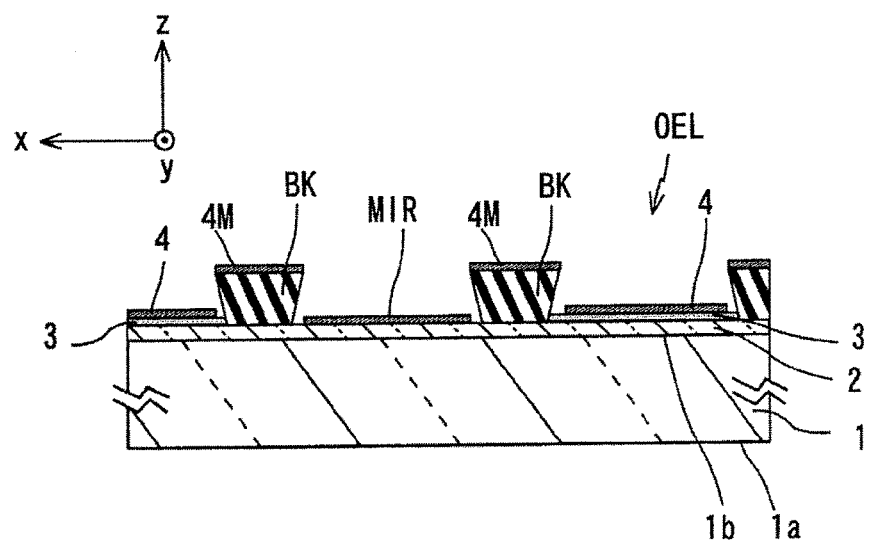
FIG. 2 is a cross-sectional view taken along line C-C in FIG. 1.

As shown in FIG. 2, each of the organic EL elements OELs is configured so that a light-transmissive electrode 2, an organic layer 3 containing a light-emitting layer, and a reflection electrode 4 are layered on a back surface 1b of the substrate 1 between the adjacent banks BKs. The light-transmissive electrode 2 is formed on the substrate 1 so as to extend in the x- and y-directions. For example, the light-transmissive electrode 2 functions as an anode common to the organic EL elements OELs. Each of the metal mirror surface portions MIRs is formed in the y-direction on the light-transmissive electrode 2 between the adjacent banks BKs. The metal mirror surface portions MIRs and the reflection electrode 4 are formed from the same material. The metal mirror surface portions MIRs are electrically connected to the light-transmissive electrode 2. The metal mirror surface portions MIRs are connected to a power supply not shown in the drawing, and function as a bus line for supplying a power supply voltage to the connected light-transmissive electrode 2. The mirror device of the embodiment functions as a so-called bottom emission type organic EL panel in which light generated in the organic layer 3 by applying a voltage between the light-transmissive electrode 2 and the reflection electrode 4 is extracted from the front surface 1a of the substrate 1.

Figure 3:
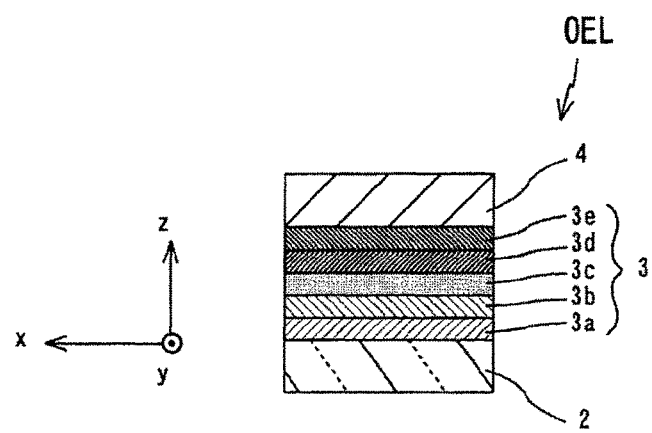
FIG. 3 is an enlarged cross-sectional view of a part of the organic EL panel according to the first embodiment.

As shown in FIG. 3, when the light-transmissive electrode 2 is an anode and the reflection electrode 4 is a cathode, the organic layer 3 of each of the organic EL elements OELs is typically configured by layering a hole injection layer 3a, a hole transport layer 3b, a light-emitting layer 3c, an electron transport layer 3d, and an electron injection layer 3e in this order from the anode to the cathode. Further, in a layered structure of the organic layer 3, components other than the substrate may be layered in reverse order. The organic layer 3 is not limited to this layered structure, and for example, may have a layered structure including at least a light-emitting layer with an additional hole block layer (not shown) between the light-emitting layer 3c and the electron transport layer 3d, or a layered structure including a charge transport layer serving as another layer. The organic layer 3 may be configured so that the layered structure does not include the hole transport layer 3b, the hole injection layer 3a, or the hole injection layer 3a and the electron transport layer 3d.

[Light-Transmissive Electrode]

The light-transmissive electrode 2 as an anode may be made of indium-tin-oxide (ITO), ZnO, ZnO—$Al_2O_3$ (i.e., AZO), $In_2O_3$—ZnO (i.e., IZO), $SnO_2$—$Sb_2O_3$ (i.e., ATO), or $RuO_2$. It is preferable that a material having a transmittance of at least 10% or more at the wavelength of light emitted from the light-emitting layer be selected for the light-transmissive electrode 2. The light-transmissive electrode 2 usually has a single-layer structure, but can have a layered structure including a metal thin film. For example, as a material for the metal thin film, an appropriate metal such as tin, magnesium, indium, calcium, aluminum, and silver, or an alloy thereof is used. Specific examples thereof may include a magnesium-silver alloy, a magnesium-indium alloy, and an aluminum-lithium alloy. A silver thin film with a thickness of 20 nm as the metal thin film has a transmittance of 50%. An Al film with a thickness of 10 nm as the metal thin film has a transmittance of 50%. An Mg—Ag alloy film with a thickness of 20 nm as the metal thin film has a transmittance of 50%. The configuration of the metal thin film depends on a material, a film forming method, and a condition. However, when the lower limit of the film thickness is 5 nm, conductivity can be ensured.

[Hole Injection Layer]

It is preferable that the hole injection layer 3a be a layer containing an electron-accepting compound (i.e., hole-transporting compound).

From the viewpoint of charge injection barrier from the anode into the hole injection layer, it is preferable that the hole-transporting compound be a compound having an ionization potential of 4.5 eV to 6.0 eV. Examples of the hole-transporting compound may include an aromatic amine derivative, a phthalocyanine derivative typified by copper phthalocyanine (so-called CuPc), a porphyrin derivative, an oligothiophene derivative, a polythiophene derivative, a benzyl phenyl derivative, a compound having a tertiary amine linked via a fluorene group, a hydrazone derivative, a silazane derivative, a silanamine derivative, a phosphamine derivative, a quinacridone derivative, a polyaniline derivative, a polypyrrole derivative, a polyphenylenevinylene derivative, a polythienylenevinylene derivative, a polyquinoline derivative, a polyquinoxaline derivative, and carbon. For example, in a case of an aromatic amine derivative, the derivative used herein includes an aromatic amine itself and a compound having an aromatic amine as a main skeleton, and the derivative may be a polymer or a monomer.

As the hole-transporting compound, a conductive polymer (so-called PEDOT/PSS) obtained by polymerizing 3,4-ethylenedioxythiophene as a polythiophene derivative in a high-molecular-weight polystyrenesulfonic acid is also preferred. Further, a terminal of the polymer of PEDOT/PSS may be capped with methacrylate or the like.

[Hole Transport Layer]

A material for the hole transport layer 3b may be a material conventionally used as a constituent material for a hole transport layer. Examples thereof may include those described in the examples of the hole-transporting compound used for the hole injection layer. Further, examples thereof may include an arylamine derivative, a fluorene derivative, a spiro derivative, a carbazole derivative, a pyridine derivative, a pyrazine derivative, a pyrimidine derivative, a triazine derivative, a quinoline derivative, a phenanthroline derivative, a phthalocyanine derivative, a porphyrin derivative, a silole derivative, an oligothiophene derivative, a condensed polycyclic aromatic derivative, and a metal complex. Furthermore, examples thereof may include a polyvinyl carbazole derivative, a polyarylamine derivative, a polyvinyl triphenylamine derivative, a polyfluorene derivative, a polyarylene derivative, a polyarylene ether sulfone derivative containing tetraphenyl benzidine, a polyarylene vinylene derivative, a polysiloxane derivative, a polythiophene derivative, and a poly(p-phenylene vinylene) derivative. The compounds may be any of an alternating copolymer, a random copolymer, a block copolymer, and a graft copolymer, and may also be a polymer having a branched main chain and three or more terminal moieties, so-called a dendrimer.

[Light-Emitting Layer]

The light-emitting layer 3c may be an independent light-emitting layer of emitting red light, green light, or blue light, or a mixed light-emitting layer thereof. Alternatively, the light-emitting layer may contain a compound having a hole-transporting property (hole-transporting compound) or a compound having an electron-transporting property (electron-transporting compound). An organic EL material may be used as a dopant material, and the hole-transporting compound, the electron-transporting compound, or the like may be appropriately used as a host material. The organic EL material is not particularly limited, and a substance that emits light at a desired emission wavelength and has favorable emission efficiency may be used.

As the organic EL material, any known material can be applied. For example, a fluorescent material or a phosphorescent material may be applied. From the viewpoint of internal quantum efficiency, the phosphorescent material is preferably used. The light-emitting layer may have a single-layer structure or if desired, a multilayer structure made from a plurality of materials. For example, the fluorescent material is used for a blue light-emitting layer and the phosphorescent material is used for a green light-emitting layer and a red light-emitting layer. Various materials may be used in combination. Further, a diffusion prevention layer may also be provided between the light-emitting layers.

Examples of a fluorescent material exhibiting blue luminescence (blue fluorescent dye) may include naphthalene, perylene, pyrene, chrysene, anthracene, coumarin, p-bis(2-phenylethenyl)benzene, and derivatives thereof.

Examples of a fluorescent material exhibiting green luminescence (green fluorescent dye) may include a quinacridone derivative, a coumarin derivative, and an aluminum complex such as tris(8-hydroxy-quinoline)aluminum (Alq3).

Examples of a fluorescent material exhibiting yellow luminescence (yellow fluorescent dye) may include rubrene and a perimidone derivative.

Examples of a fluorescent material exhibiting red luminescence (red fluorescent dye) may include a 4-(dicyanomethylene)-2-methyl-6-(p-dimethylaminostyryl)-4H-pyran (DCM)-based compound, a benzopyran derivative, a rhodamine derivative, a benzothioxanthene derivative, and azabenzothioxanthene.

Examples of the phosphorescent material may include an organometallic complex containing metal selected from Groups 7 to 11 of the long-periodic table (hereinafter, unless particularly otherwise noted, "the periodic table" is intended to refer to the long-periodic table). Preferable examples of metal selected from Groups 7 to 11 of the periodic table may include ruthenium, rhodium, palladium, silver, rhenium, osmium, iridium, platinum, and gold. A ligand of the complex is preferably a ligand in which a (hetero)aryl group is coupled with pyridine, pyrazole, phenanthroline, or the like, such as a (hetero)arylpyridine ligand and a (hetero)arylpyrazole ligand, and particularly preferably a phenylpyridine ligand or a phenylpyrazole ligand. Here, a (hetero)aryl represents an aryl group or a heteroaryl group.

Specific examples of the phosphorescent material may include tris(2-phenylpyridine) iridium (so-called Ir(ppy)3), tris(2-phenylpyridine) ruthenium, tris(2-phenylpyridine) palladium, tris(2-phenylpyridine) platinum, tris(2-phenylpyridine) osmium, tris(2-phenylpyridine) rhenium, octaethyl platinum porphyrin, octaphenyl platinum porphyrin, octaethyl palladium porphyrin, and octaphenyl palladium porphyrin.

The light-emitting layer may contain a hole-transporting compound as its constituent material. Among hole-transporting compounds, examples of a hole-transporting compound having a low molecular weight may include various compounds described as the examples of the hole-transporting compound in the hole injection layer 3a, an aromatic diamine including two or more tertiary amines and two or more condensed aromatic rings substituted with nitrogen atoms, which is typified by diphenyl naphthyl diamine (so-called α-NPD), an aromatic amine compound having a starburst structure such as 4,4',4"-tris(1-naphthyl phenylamino)triphenylamine, an aromatic amine compound having a tetramer of triphenylamine, and a spiro compound such as 2,2',7,7'-tetrakis-(diphenylamino)-9,9'-spirobifluorene.

The light-emitting layer may contain an electron-transporting compound as its constituent material. Among electron-transporting compounds, examples of an electron-transporting compound having a low molecular weight may include 2,5-bis(1-naphthyl)-1,3,4-oxadiazole (so-called BND), 2,5-bis(6'-(2',2"-bipyridyl))-1,1-dimethyl-3,4-diphenylsilole (so-called PyPySPyPy), basophenanthroline (so-called BPhen), 2,9-dimethyl-4,7-diphenyl-1,10-phenanthroline (so-called BCP, bathocuproin), 2-(4-biphenylyl)-5-(p-tert-butylphenyl)-1,3,4-oxadiazole (so-called tBu-PBD), and 4,4'-bis(9H-carbazol-9-yl)biphenyl (so-called CBP).

[Electron Transport Layer]

The electron transport layer 3d is provided to further improve the emission efficiency of the organic EL elements, and is formed from an electron-transporting compound capable of efficiently transporting an electron injected from a cathode toward the light-emitting layer between electrodes to which an electric field is applied.

As the electron-transporting compound used for the electron transport layer, a compound that has high electron injection efficiency from the cathode or the electron injection layer 3e and high electron mobility and is capable of efficiently transporting an injected electron is usually used. Examples of a compound satisfying the conditions may include a metal complex such as Alq3 and 10-hydroxybenzo[h]quinoline, an oxadiazole derivative, a distyryl biphenyl derivative, a silole derivative, a 3-hydroxyflavone metal complex, a 5-hydroxyflavone metal complex, a benzoxazole metal complex, a benzothiazole metal complex, trisbenzimidazolylbenzene, a quinoxaline compound, a phenanthroline derivative, 2-tert-butyl-9,10-N,N'-dicyanoanthraquinonediimine, n-type hydrogenated amorphous silicon carbide, n-type zinc sulfide, and n-type zinc selenide.

[Electron Injection Layer]

The electron injection layer 3e plays a role of efficiently injecting an electron injected from the cathode into the electron transport layer or the light-emitting layer. For the electron injection layer 3e, an organic electron transport compound typified by a nitrogen-containing heterocyclic compound such as bathophenanthroline and a metal complex such as an aluminum complex of 8-hydroxyquinoline is used. When the electron injection layer 3e of the organic electron transport compound is doped with an electron-donating material, the electron injection efficiency can be enhanced. As the electron-donating material, for example, an alkali metal such as sodium and potassium, an alkali earth metal such as barium and calcium, a compound thereof (CsF, $Cs_2CO_3$, $Li_2O$, and LiF), and an alkali metal such as sodium, potassium, cesium, lithium, and rubidium may be used.

As a procedure for forming each layer in the organic layer 3, a dry coating method such as a sputtering method and a vacuum deposition method and a wet coating method such as screen printing, a spraying method, an inkjet method, a spin coating method, gravure printing, and a roll coater method are known. For example, the hole injection layer, the hole transport layer, and the light-emitting layer may be formed by a wet coating method so that each film thickness is uniform, and the electron transport layer and the electron injection layer may be each formed in turn by a dry coating method so that each film thickness is uniform. Further, all functional layers may be formed in turn by a wet coating method so that each film thickness is uniform.

[Reflection Electrode]

In order to efficiently inject an electron, it is preferable that a material for the reflection electrode 4 as a cathode include a metal having a low work function. For example, an appropriate metal such as tin, magnesium, indium, calcium, aluminum, and silver, or an alloy thereof is used. Specific examples thereof may include an electrode made of an alloy having a low work function, such as a magnesium-silver alloy, a magnesium-indium alloy, and an aluminum-lithium alloy. The reflection electrode 4 may be formed as a single-layer film or a multilayer film on the organic layer 3 by a sputtering method or a vacuum deposition method. The film thickness is not restricted as long as it can maintain the reflection action of the reflection electrode 4.

Figure 4:
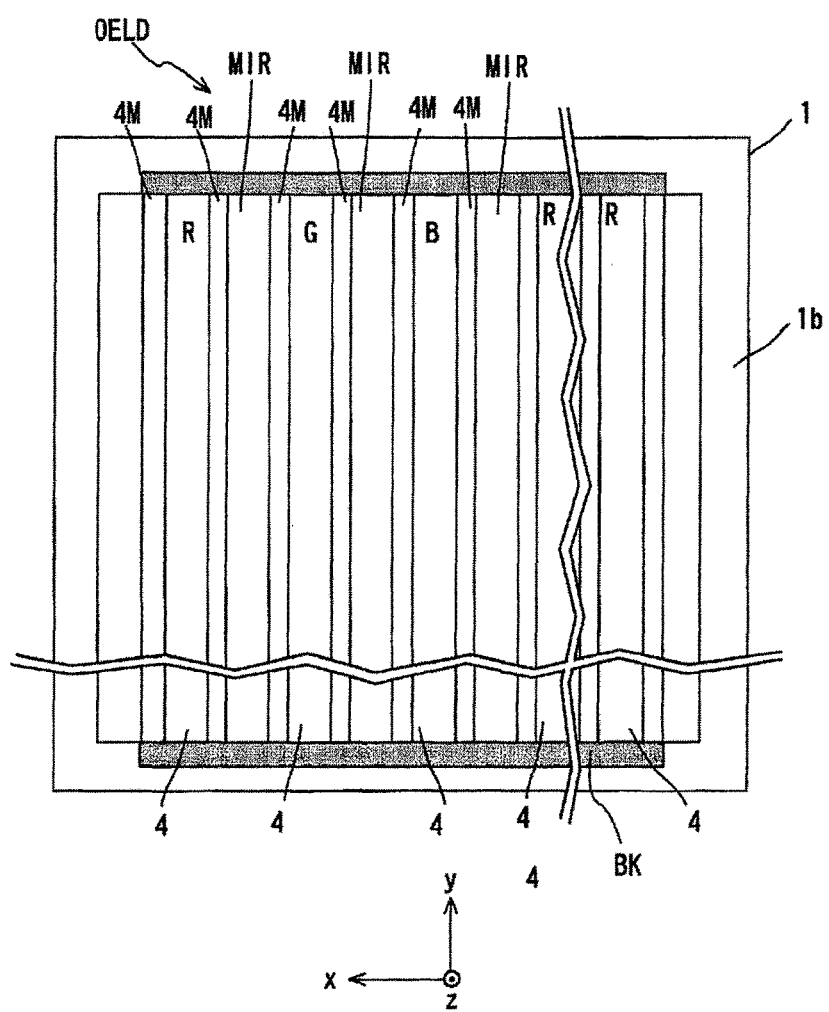
FIG. 4 is a rear view of the mirror device of the organic EL panel shown in FIG. 1, which is partially cut out.

FIG. 4 shows the organic EL panel OELD viewed from a side of the back surface 1b of the substrate 1. The metal mirror surface portions MIRs and the reflection electrodes 4 are formed in the y-direction between the adjacent banks BKs. The metal mirror surface portions MIRs and the reflection electrodes 4 are formed with the use of the banks BKs having a reverse-tapered structure in which a width between sides of the bank BK shown in FIG. 2 is narrowed toward the light-transmissive electrode 2. The banks BKs having a reverse-tapered structure are formed from a light-transmissive dielectric material along the y-direction on the light-transmissive electrode 2 by photolithography or the like. The predetermined organic layers 3 are formed at every two spaces between the banks BKs on the light-transmissive electrode 2 by an inkjet method. Subsequently, a film is formed from the reflection electrode material on the organic layers 3 and the light-transmissive electrode 2 between the banks BKs, and the top surfaces of the banks BKs by a vapor deposition method or the like. A metal film of the reflection electrode material is divided into the metal mirror surface portions MIRs and the reflection electrodes 4 through the banks BKs, as shown in FIG. 2. Metal films 4Ms are also formed from the same material as that for the metal mirror surface portions MIRs and the reflection electrodes 4 on the top surfaces of the banks BKs. If the banks BKs are formed from a transparent dielectric material, the metal films 4Ms contribute to a mirror function of the mirror device. In the first embodiment, mirrors of the metal mirror surface portions MIRs and the metal films 4Ms, which are viewed from the front face, can be brought close to the organic EL elements OELs so as to overlap. According to this method, the reflection electrodes 4 of the organic EL elements OELs and a bus line also serving as a mirror can be formed simultaneously. This is largely advantageous.

Figure 5:
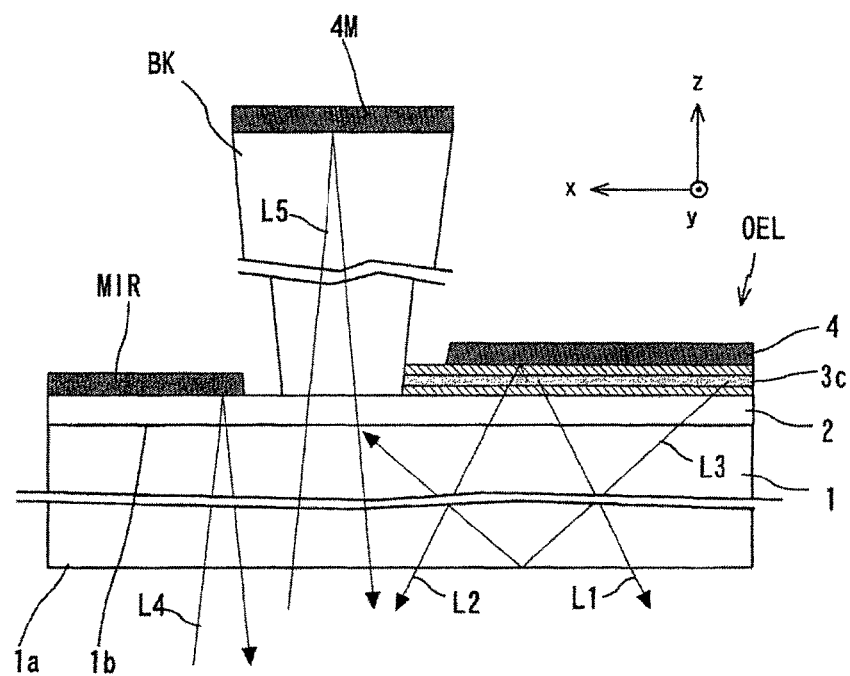
FIG. 5 is a schematic cross-sectional view of a part of the organic EL panel of the first embodiment of the present invention, illustrating the operation thereof.

Next, the operation of the organic EL panel of the mirror device will be described with reference to FIG. 5. When a driving voltage is applied to the light-emitting layer 3c in the organic layer through the light-transmissive electrode 2 and the reflection electrode 4, light generated in the light-emitting layer 3c passes through the light-transmissive electrode 2, and reflects on the reflection electrode 4 and passes through the light-transmissive electrode 2. Thus, several tens percent of the light is extracted from the front surface of the light-transmissive substrate 1. Specifically, of light emitted from the light-emitting layer 3c, light L1 with an angle that is less than the critical angle of each interface passes through the light-transmissive electrode 2 and proceeds toward the glass substrate 1, and other light L2 proceeding toward the reflection electrode 4 is reflected by the reflection electrode 4, passes through the light-emitting layer 3c and the light-transmissive electrode 2, and proceeds toward the glass substrate 1. The light L1 and the light L2 are emitted toward a front space of the substrate 1. Light L3 with an angle that exceeds the critical angle is totally reflected and proceeds toward the banks BKs. Light emitted from an edge face of the light-emitting layer 3c and light proceeding in a transverse direction also enter the banks BKs. The lights that enter the banks BKs are reflected by the metal films 4Ms and the like, pass through the substrate 1 from the banks BKs, and are emitted toward a space on the front surface side. In contrast, lights L4 and L5 from the outside that enter from the space on the front surface side of the substrate 1 are reflected by the metal mirror surface portions MIRs and the metal films 4Ms of the banks BKs between the organic EL elements OELs and further also reflected by the reflection electrode 4, and emitted outside.

Hereinafter, in a modified example of the first embodiment, a portion different from that in the first embodiment will be mainly described with reference to FIGS. 6 and 7. Components represented by the same reference signs as in the first embodiment are the same as described above, and therefore detailed description thereof will be omitted.

Figure 6:
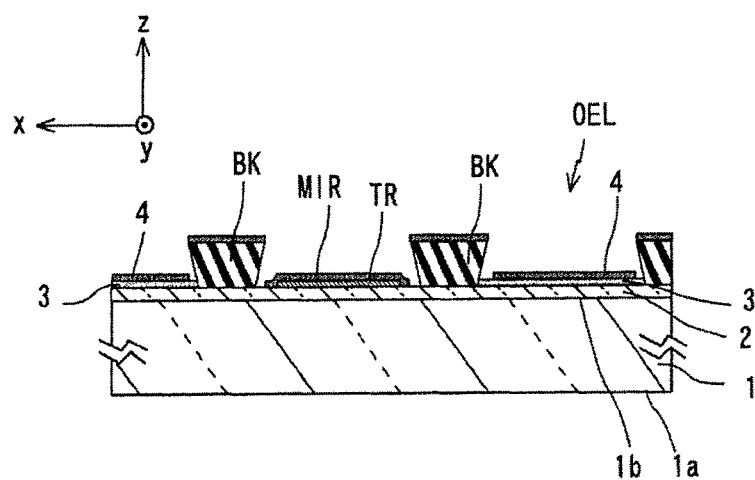
FIG. 6 is a schematic cross-sectional view of a part of an organic EL panel according to a modified example of the first embodiment.

FIG. 6 shows a modified example of a mirror device that is the same as in the first embodiment shown in FIG. 2 except that a transparent dielectric material film TR is disposed between a metal mirror surface portion MIR and a light-transmissive electrode 2. The metal mirror surface portion MIR is electrically connected to the light-transmissive electrode 2 at a gap between the transparent dielectric material film TR and a bank BK adjacent to the film, and functions as a bus line. When the film thickness is adjusted using the transparent dielectric material film TR, a mirror surface in which a distance between a back surface 1b of a substrate 1 and a reflection electrode 4 and a distance between the back surface 1b and the metal mirror surface portion MIR are the same can be obtained.

Figure 7:
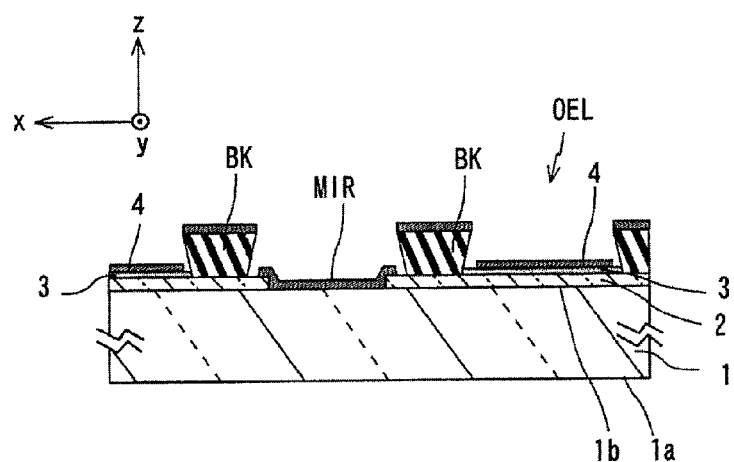
FIG. 7 is a schematic cross-sectional view of a part of an organic EL panel according to a modified example of the first embodiment.

FIG. 7 shows a modified example of a mirror device that is the same as in the first embodiment shown in FIG. 2 except that metal mirror surface portions MIRs come into contact with a substrate 1. In the embodiment shown in FIG. 2, the light-transmissive electrode 2 is formed on the substrate 1 so as to extend in the x and y directions, and for example, functions as an anode common to a plurality of organic EL elements OELs. However, in this modified example, strip-shaped light-transmissive electrodes 2As are aligned between banks BKs on the substrate 1 for each of the organic EL elements OELs so as to extend in parallel in the y direction, and connected to the metal mirror surface portions MIRs.

The mirror device having each of the above-described configurations can be utilized as an illuminated mirror such as a hand mirror and a vanity mirror, and can be utilized as an advertising board or an illuminator also serving as a mirror attached to a pillar or a ceiling to make a space of a store look wide.

Second Embodiment

Hereinafter, regarding a second embodiment, a portion different from that in the first embodiment will be mainly described with reference to FIG. 8. Components represented by the same reference signs as in the first embodiment are the same as described above, and therefore detailed description thereof will be omitted.

Figure 8:
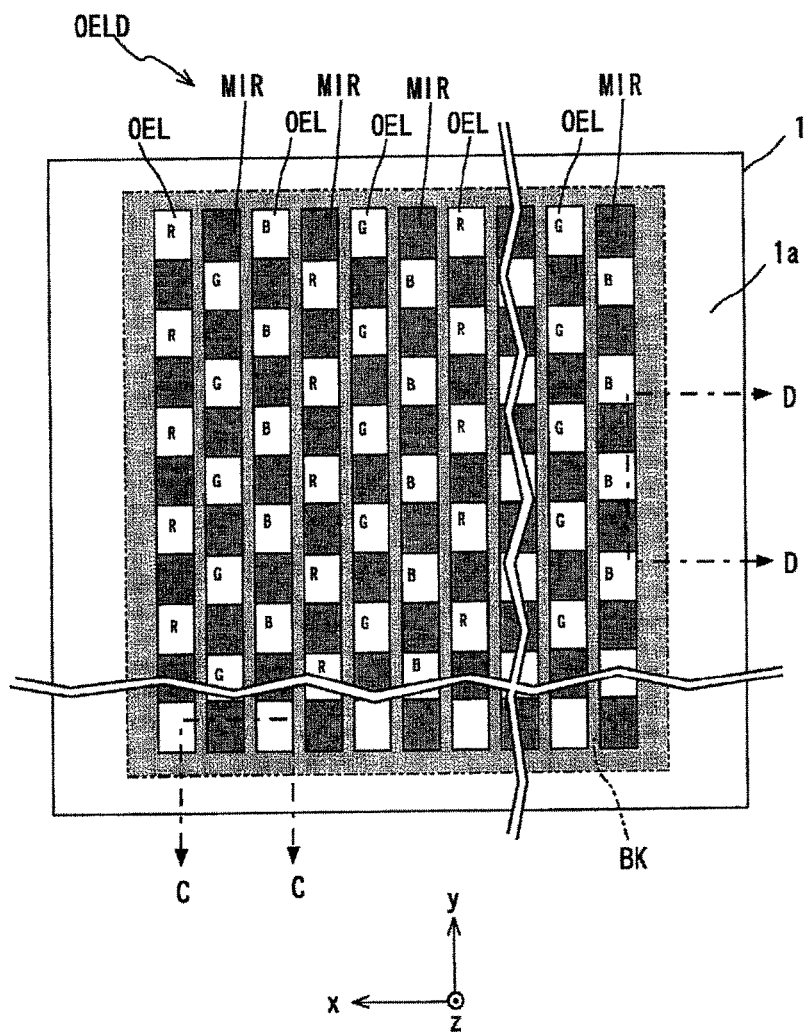
FIG. 8 is a front view of a mirror device of an organic EL panel according to a second embodiment of the present invention, which is partially cut out.

As shown in FIG. 8, the second embodiment has the same configuration as in the first embodiment except that organic EL elements OELs and metal mirror surface portions MIRs are each disposed in a checkered pattern, that is, a matrix of a rectangle shape, not in a stripe shape. Specifically, a red organic EL element R, a metal mirror surface portion MIR, a blue organic EL element B, a metal mirror surface portion MIR, a green organic EL element G, a metal mirror surface portion MIR, and again a red organic EL element R are aligned in this order in an x direction as one direction on a substrate 1, and light-emitting portions are aligned in a bank-extending direction (y direction) that crosses the x direction so that luminescent colors of the light-emitting portions at each column are the same during emission of all the light-emitting portions. Also in this case, the light-emitting portions of the organic EL elements OELs and the metal mirror surface portions MIRs are alternately disposed at constant intervals. The organic EL elements OELs and the metal mirror surface portions MIRs that are aligned in a matrix or in stripes are disposed so that the light-emitting portions emit light at uniform distribution during emission of light.

Figure 9:
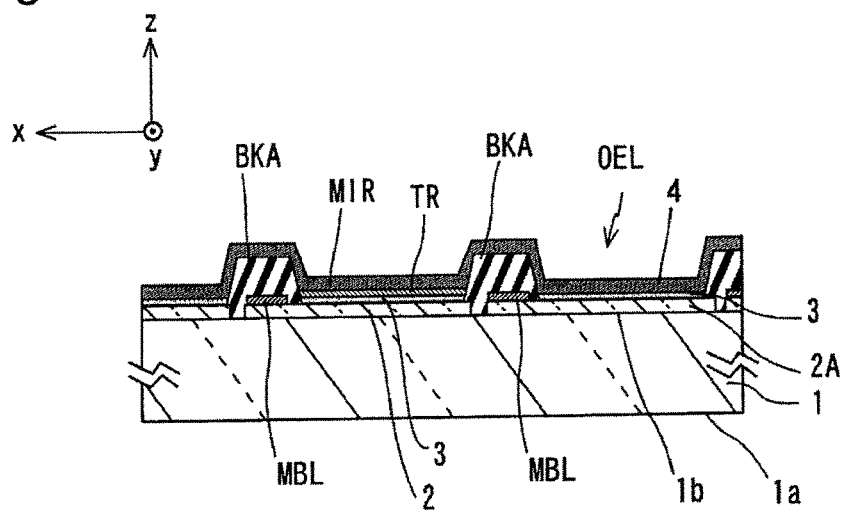
FIG. 9 is a cross-sectional view taken along line C-C in FIG. 8.

As shown in FIG. 9, in the second embodiment, a metal film of a reflection electrode material is not divided into the metal mirror surface portions MIRs and reflection electrodes 4 by, not using banks BKs having a reverse-tapered structure, using banks BKAs having a so-called forward-tapered structure in which a width between sides of the bank is widened toward a light-transmissive electrode 2. The metal mirror surface portions MIRs and the reflection electrodes 4 are formed from the same metal, and become common electrodes having the same electric potential. Further, strip-shaped light-transmissive electrodes 2A are aligned between the banks BKs on the substrate 1 for each of the organic EL elements OELs so as to extend in parallel in the y direction. A metal bus line MBL that is electrically connected to supply a supply voltage to the light-transmissive electrodes 2A is formed on end edges of each of the light-transmissive electrodes 2A buried in the banks BKs so as to extend in the y direction. The bus line MBL of each of the organic EL elements OELs is connected to an element driving unit, which is not shown in the drawing. Since a transparent dielectric material film TR is disposed between the metal mirror surface portions MIRs and the organic layers 3 to achieve electrical insulation, an organic EL element is not formed directly under the metal mirror surface portions MIRs, but a non-light-emitting portion is formed.

Figure 10:
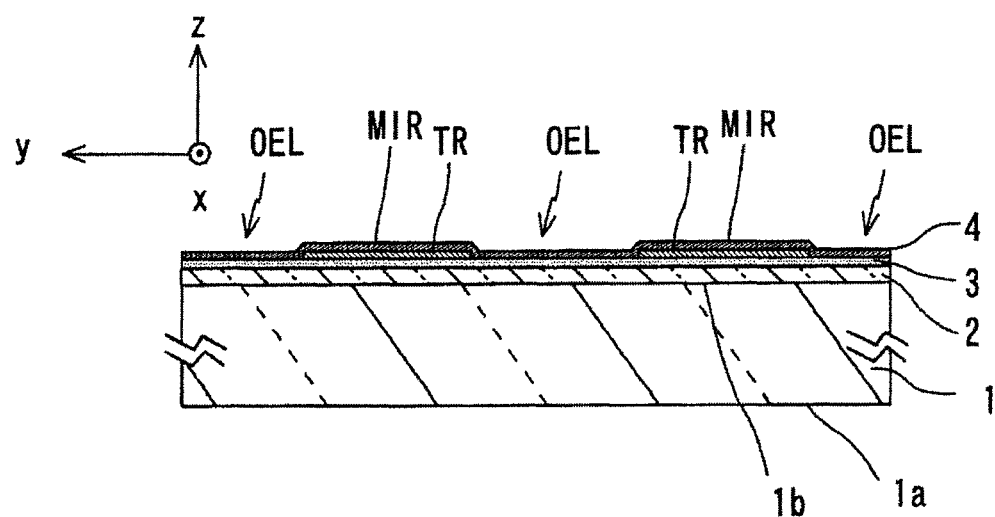
FIG. 10 is a cross-sectional view taken along line D-D in FIG. 8.

As shown in FIG. 10, the light-emitting portions of the organic EL elements OELs and the metal mirror surface portions MIRs are alternately disposed in the y direction between the adjacent banks BKs. Similarly to FIG. 9, since the transparent dielectric material film TR is disposed between the metal mirror surface portions MIRs and the organic layers 3 to achieve insulation, a non-light-emitting portion that is not the organic EL element is formed directly under the metal mirror surface portions MIRs.

In a modified example of the second embodiment, a portion different from that in the second embodiment will be mainly described with reference to FIG. 11. Components represented by the same reference signs as in the second embodiment are the same as described above, and therefore detailed description thereof will be omitted.

Figure 11:
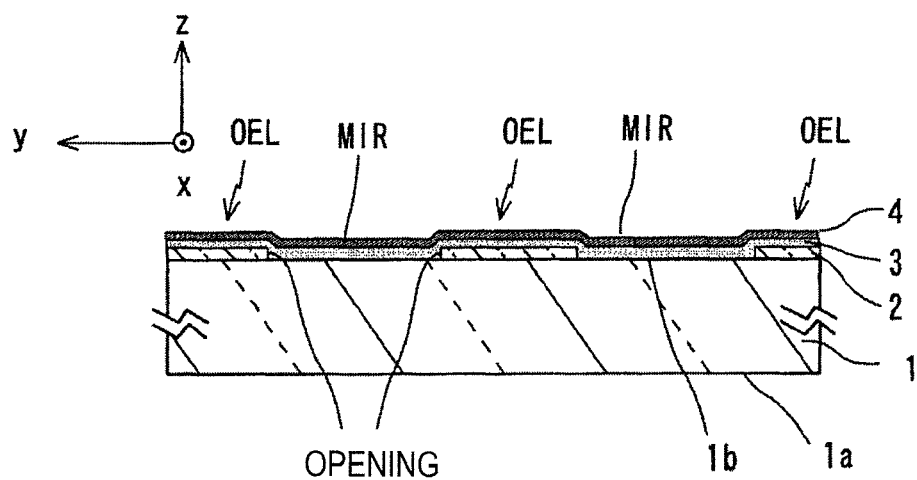
FIG. 11 is a schematic cross-sectional view of a part of an organic EL panel according to a modified example of the second embodiment.

FIG. 11 shows a modified example of a mirror device that is the same as in the embodiment shown in FIG. 10 except that a transparent dielectric material film is not provided directly under a metal mirror surface portion MIR and a through-opening is provided at a portion to form the metal mirror surface portion MIR in a light-transmissive electrode 2. Although the metal mirror surface portion MIR made of a reflection electrode material is in contact with an organic layer 3, the light-transmissive electrode 2 does not exist. Therefore, a non-light-emitting portion is provided directly under the metal mirror surface portion MIR.

Figure 12:
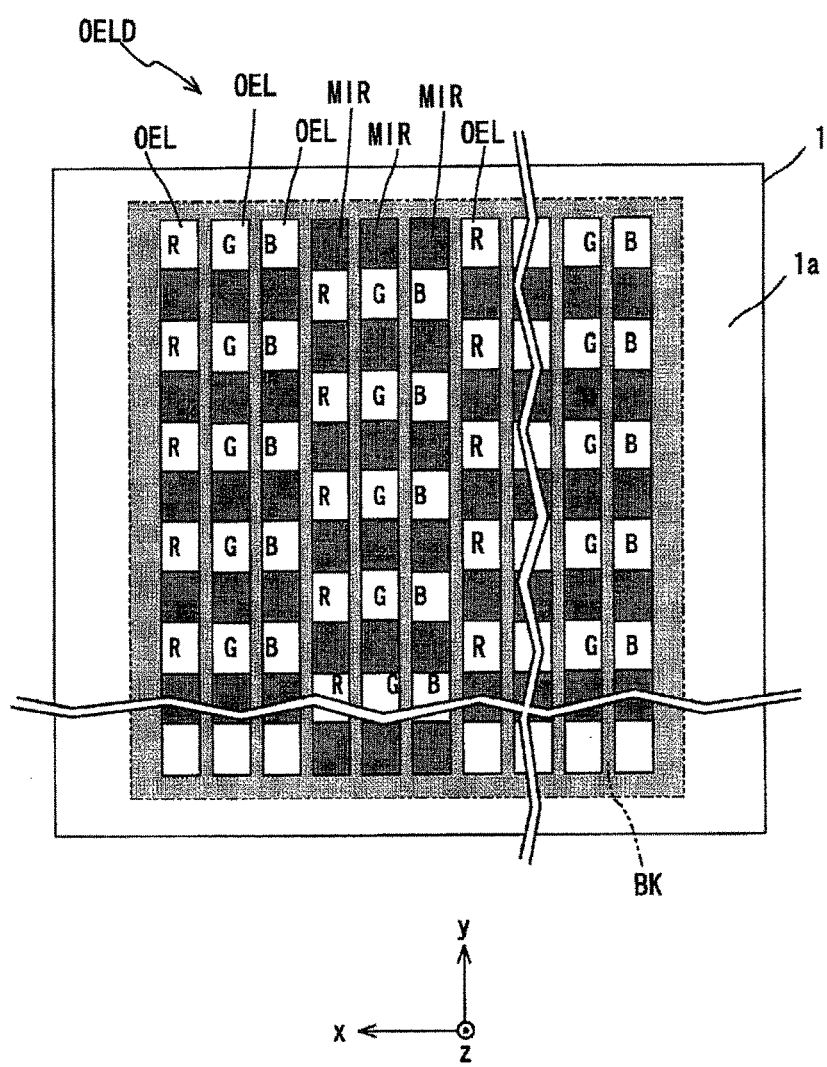
FIG. 12 is a front view of a mirror device of an organic EL panel according to another modified example of the second embodiment, which is partially cut out.

FIG. 12 shows a modified example of a mirror device that is the same as in the embodiment shown in FIG. 8 except that every group of light-emitting portions of organic EL elements OELs and metal mirror surface portion MIRs is disposed. In the embodiment of FIG. 8, each of the organic EL elements OELs and each of the metal mirror surface portions MIRs are disposed necessarily alternately. In the modified example, as shown in FIG. 12, three organic EL elements (R, G, and B) are aligned at every line (x direction) and three metal mirror surface portions MIRs are aligned behind the organic EL elements, and the organic EL elements OELs and the metal mirror surface portions MIRs are alternately aligned at every column (y direction). Thus, the organic EL elements and the metal mirror surface portions are alternately disposed in a group configuration in which the organic EL elements are divided into organic EL element groups of which the number is less than the number of the organic EL elements, the metal mirror surface portions are similarly divided into metal mirror surface portion groups of which the number is less than the number of the metal mirror surface portions, and the groups of the metal mirror surface portions MIRs and the groups of the organic EL elements are alternately disposed. Therefore, in the mirror device, each of groups of the metal mirror surface portions MIRs and each of groups of the organic EL elements OELs may be alternately disposed.

In the mirror device according to any of above-described aspects, a sealing member that covers a plurality of light-emitting portions of organic EL elements formed on a back surface 1b of a substrate 1 and seals the light-emitting portions, which is not shown in the drawings, is provided. As the sealing member, a transparent dish-shaped sealing cap made of glass may be used. The transparent sealing cap is fixed around the light-emitting portions through an adhesive so as to cover the light-emitting portions. Thus, the light-emitting portions are hermetically sealed and protected. The inside of the transparent sealing cap may be charged with an inert gas or an inert liquid to achieve sealing. As the sealing member, a sealing film with gas barrier property made of a transparent resin such as poly(p-xylylene) and multilayers of an inorganic film such as a silicon oxide film and an organic film may be used. As described above, it is preferable that the light-emitting portions of the organic EL elements be configured so as not to come into contact with moisture and oxygen in the air by means of the sealing member.

In the embodiments described above, as the light-transmissive substrate 1, a plate made of quartz glass or glass, a metal plate, a metal foil, a flexible resin substrate, a plastic film or sheet, or the like, can be used. In particular, a glass plate, and a transparent plate made of a synthetic resin such as polyester, polymethacrylate, polycarbonate, and polysulfone are preferred. In a case of using a synthetic resin substrate, the gas barrier property should be noted. When the gas barrier property of the substrate is too low, the organic EL elements may deteriorate due to the air that passes through the substrate. Therefore, this is not preferable. Accordingly, one of preferable methods is a method in which a compact silicon oxide film or the like is provided on at least one side of the synthetic resin substrate to ensure the gas barrier property.

In order to enhance the light extraction efficiency of emitted light, a light extraction uneven structure (not shown) may be formed on a front surface 1a of the substrate 1 so as to cover the light-emitting portions and have an area larger than that of the light-emitting portions, for example, by a water-blasting method or a fine sand-blasting method. Further, a light extraction film (not shown) may be attached.

In the embodiments described above, the so-called bottom emission type organic EL panel in which the light-transmissive electrode 2 is formed on a back surface of the light-transmissive substrate 1 and light generated in the organic layer 3 is extracted from the front surface 1a of the substrate 1 has been described. In another embodiment, a mirror device of so-called top emission type organic EL panel can also be configured.

Third Embodiment

Hereinafter, in a third embodiment of top emission type organic EL panel in which an order of forming a light-transmissive electrode and a reflection electrode is changed, a portion different from that in the first embodiment will be mainly described with reference to FIG. 13. Components represented by the same reference signs as in the first embodiment are the same as described above, and therefore detailed description thereof will be omitted.

Figure 13:
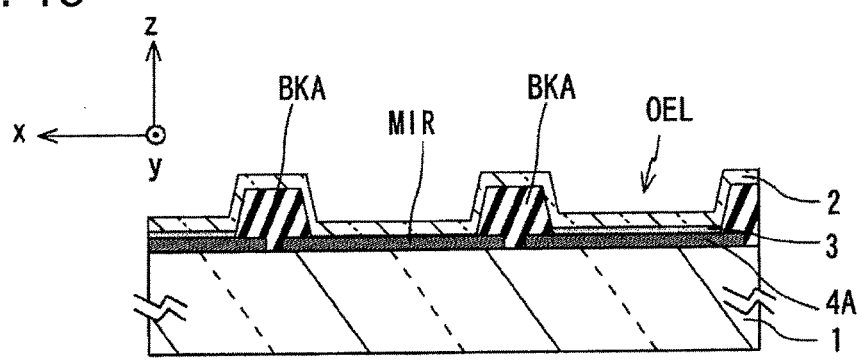
FIG. 13 is a schematic cross-sectional view of a part of an organic EL panel according to a third embodiment of the present invention.

As shown in FIG. 13, the third embodiment has the same configuration as in the first and second embodiments except that a bank BKA having a forward-tapered structure is used, a reflection electrode 4A, an organic layer 3, and a light-transmissive electrode 2 are disposed in this order from a side of a substrate, the reflection electrode 4A that is a cathode of a strip shape and a metal mirror surface portion MIR are aligned at every space between the banks BKAs so as to extend in parallel in a y direction on the substrate 1. As shown in FIG. 13, in each of organic EL elements in a mirror device of top emission type organic EL panel, the light-transmissive electrode 2 is formed on the organic layer 3 and the metal mirror surface portion MIR so as to extend in the x and y directions. For example, the light-transmissive electrode 2 functions as an anode common to the plurality of organic EL elements OELs. The metal mirror surface portion MIR is electrically connected to the light-transmissive electrode 2. The metal mirror surface portion MIR is connected to a power supply not shown in the drawing, and functions as a bus line for supplying a power supply voltage to the connected light-transmissive electrode 2. In this embodiment, most of light generated in the organic layer 3 by applying a voltage to the light-transmissive electrode 2 and the reflection electrode 4A is extracted from a side of the light-transmissive electrode 2.

In the embodiments described above, the organic layer is a light-emitting layered body, but the light-emitting layered body may be configured by layering inorganic material films.

In the embodiments described above, an example in which a plurality of organic EL elements R, G, B are aligned has been shown, but the present invention is not limited to the embodiments. Even when a plurality of white light-emitting organic EL elements using a layered structure of light-emitting layers such as a tandem structure including a plurality of light-emitting layers or a mixed light-emitting layer are aligned, the same effect can be obtained.

REFERENCE SIGNS LIST 1 substrate
2 light-transmissive electrode
3 organic layer
3a hole injection layer
3b hole transport layer
3c light-emitting layer
3d electron transport layer
3e electron injection layer
4 reflection electrode
4M metal film
BK bank
MBL bus line
MIR metal mirror surface portion
OEL organic EL element

The invention claimed is:
1. A light-emitting device comprising:
a plurality of organic EL elements that are aligned on a substrate,
a plurality of mirror surface portions, wherein
each of the plurality of organic EL elements has an organic layer that is formed between a light-transmissive electrode and a reflection electrode and contains a light-emitting layer,
the plurality of organic EL elements emit light of a plurality of luminescent colors different from each other,
the light-transmissive electrode and part of the mirror surface portion overlap each other, and
the mirror surface portion and the organic layer are positioned apart from each other.
2. The light-emitting device according to claim 1, wherein the plurality of luminescent colors are red, green and blue.
3. The light-emitting device according to claim 1, wherein the plurality of organic EL elements and the plurality of mirror surface portions are each strip-shaped and are each aligned in stripes at a uniform interval.

4. The light-emitting device according to claim 1, wherein the plurality of organic EL elements and the plurality of mirror surface portions are each aligned in a matrix.

5. The light-emitting device according to claim 1, wherein the plurality of mirror surface portions and the reflection electrodes are formed from the same material.

6. The light-emitting device according to claim 1, wherein at least a portion of the mirror surface portions is electrically connected to the light-transmissive electrode.

* * * * *